(12) United States Patent
Burchard et al.

(10) Patent No.: US 11,671,924 B2
(45) Date of Patent: Jun. 6, 2023

(54) RECEIVING STRONGEST SIGNAL IN AN RF RECEIVER

(71) Applicant: NXP B.V., Eindhoven (NL)

(72) Inventors: Artur Tadeusz Burchard, Eindhoven (NL); Petr Kourzanov, Eindhoven (NL)

(73) Assignee: NXP B.V., Eindhoven (NL)

( * ) Notice: Subject to any disclaimer, the term of this patent is extended or adjusted under 35 U.S.C. 154(b) by 120 days.

(21) Appl. No.: 16/908,930

(22) Filed: Jun. 23, 2020

(65) Prior Publication Data

US 2021/0400597 A1      Dec. 23, 2021

(51) Int. Cl.
*H04W 52/24* (2009.01)
*H04W 52/52* (2009.01)
*H04W 74/08* (2009.01)

(52) U.S. Cl.
CPC ....... *H04W 52/245* (2013.01); *H04W 52/243* (2013.01); *H04W 52/52* (2013.01); *H04W 74/0808* (2013.01)

(58) Field of Classification Search
CPC ........... H04W 52/245; H04W 74/0808; H04W 52/52; H04W 52/243
See application file for complete search history.

(56) References Cited

U.S. PATENT DOCUMENTS

| 8,391,192 B2 | 3/2013 | Prakash et al. | |
| 2005/0100119 A1 | 5/2005 | Husted et al. | |
| 2007/0264950 A1 | 11/2007 | Husted et al. | |
| 2012/0115416 A1* | 5/2012 | Yucek | H04B 1/109 455/41.2 |
| 2012/0166256 A1* | 6/2012 | Wang | G07B 15/063 455/67.14 |
| 2013/0083676 A1* | 4/2013 | Stager | H04L 27/0006 370/252 |
| 2017/0264356 A1* | 9/2017 | Abramsky | H04B 1/406 |
| 2019/0386860 A1* | 12/2019 | Blonskey | H04L 27/14 |
| 2020/0396695 A1* | 12/2020 | Bhushan | H04W 52/243 |

OTHER PUBLICATIONS

Punal, O., "Experimental Characterization and Modeling of RF Jamming Attacks on VANETs", IEEE Transactions on Vehicular Technology, vol. 64, No. 2, Feb. 2015.

\* cited by examiner

*Primary Examiner* — Pao Sinkantarakorn
*Assistant Examiner* — Kabir U Jahangir

(57) ABSTRACT

In connection with an RF communication system, exemplary aspects may involve a method and apparatus for use in a communication system in which a RF receiver may be detecting and processing a first signal in an RF channel. Thereafter, a second received signal may be detected, with the second received signal being assessed, by receiver circuitry, as stronger than the first received signal. In response to the assessment of the second received signal being stronger than the first received signal, the RF receiver circuitry may adjust the gain or signal amplification circuitry for continuing to process the second, stronger, received signal in place of the first, weaker, received signal.

19 Claims, 4 Drawing Sheets

RECEIVING STRONGEST SIGNAL IN AN RF RECEIVER

OVERVIEW/BACKGROUND

Aspects of various embodiments are directed to an RF (radio frequency) receiver detecting transmitted data from a channel which may contain more than one transmitter and upon detection of signal strength, switching reception to the strongest detected signal.

In most V2X application scenarios, reliable reception of 802.11p transmissions is a prerequisite that enables performance, reliability and safety of vehicular traffic. In congested urban scenarios, where hidden nodes prevent effective leveraging of the "talk before listen" (CSMA/CA) protocol, it becomes of paramount importance to receive packets pertaining to the safety neighborhood of the car (perimeter proportionally depends on environment, speed and type of the vehicle). Another problem are RF signal collisions which are related to amount of traffic on the channel. Due to the random-access policy for CSMA/CA and limited amount of Tx (transmission) Slots to choose from sometimes stations will draw the same random number and transmit at the same Tx Slot causing collisions. In both cases of hidden node and collisions a situation may occur when weak (far away) and strong (close by) packets coexist.

These and other matters have presented challenges to successful detection of RF transmissions of strong and weak signals occurring at the same time on the same channel, for a variety of applications.

SUMMARY OF CERTAIN EXAMPLES

Various example embodiments are directed to issues such as those addressed above and/or others which may become apparent from the following disclosure involving a method and apparatus in which an RF (radio frequency) receiver detects transmitted data from a channel which may contain more than one transmitter.

In certain example embodiments, aspects of the present disclosure may involve a method for use in a communication system in which a RF receiver may be detecting and processing a first signal in an RF channel. Thereafter, a second received signal may be detected, with the second received signal being assessed, by receiver circuitry, as stronger than the first received signal. In response to the assessment of the second received signal being stronger than the first received signal, the RF receiver circuitry may adjust the gain or signal amplification circuitry for continuing to process the second, stronger, received signal in place of the first, weaker, received signal.

In another example, the present disclosure is directed to a method where assessing that the second received signal is stronger than the first received signal includes or is associated with performing data packet acquisition from the second received signal in parallel with said processing a first received signal by the RF receiver. Further, steps may include aborting the step of processing the first received signal in response to the step of assessing that the second received signal is stronger than the first received signal.

In more specific examples, an RF receiver may be located in a vehicle. The RF receiver may include circuitry to assess the incoming signal and, based on the assessment, use circuitry to adjust the AGC or signal-amplification. Steps of processing and assessing may be performed while at least the vehicle or a signal-transmit station, from which the first signal or the second signal is transmitted, is moving.

In yet another specific example, the RF receiver may be part of a transceiver that communicates data wirelessly via CSMA or 802.11 communications protocols.

The above discussion/summary is not intended to describe each embodiment or every implementation of the present disclosure. The figures and detailed description that follow also exemplify various embodiments.

BRIEF DESCRIPTION OF FIGURES

Various example embodiments may be more completely understood in consideration of the following detailed description in connection with the accompanying drawings, in which.

Figure 1:
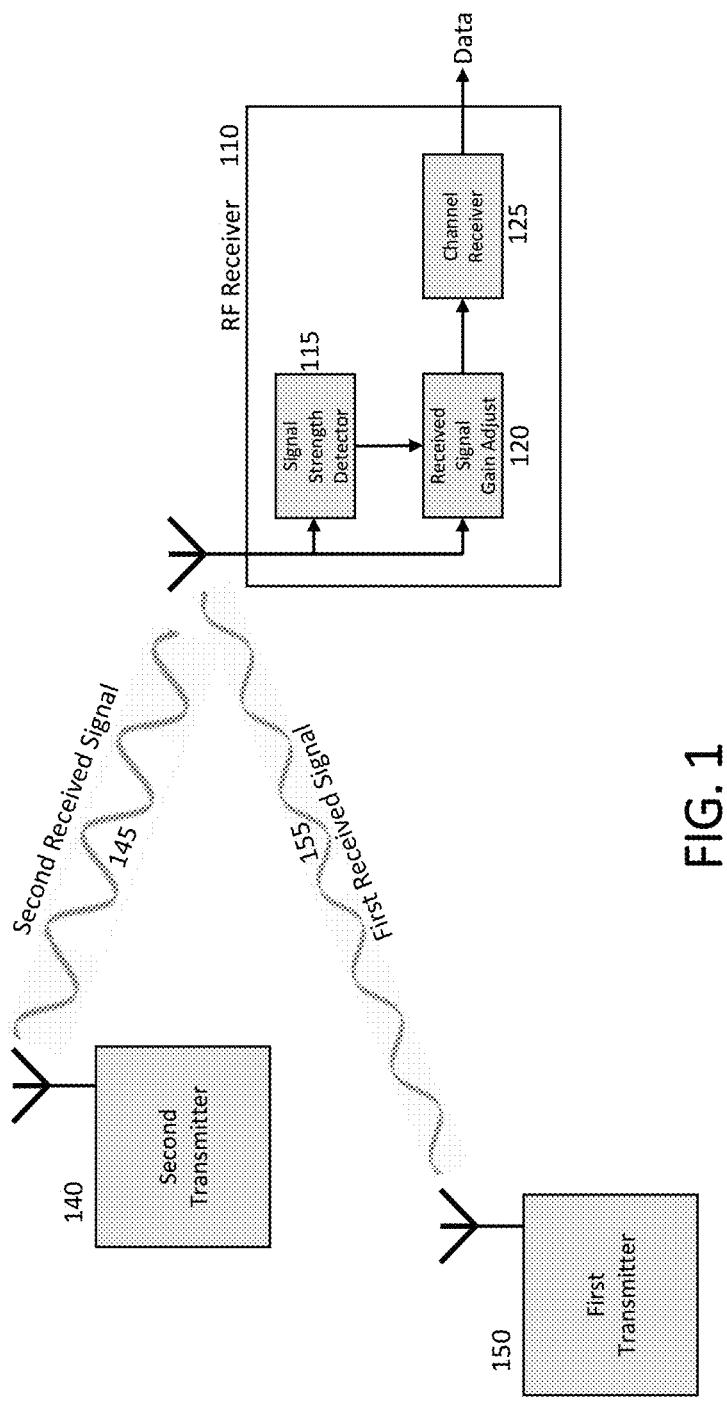
FIG. 1 is a system-level diagram illustrating an example of an RF receiver detecting a first RF transmitted signal and a stronger signal from a second RF transmitter, in accordance with the present disclosure.

While various embodiments discussed herein are amenable to modifications and alternative forms, aspects thereof have been shown by way of example in the drawings and will be described in detail. It should be understood, however, that the intention is not to limit the disclosure to the particular embodiments described.

More Detailed Description

Aspects of the present disclosure are believed to be applicable to a variety of different types of apparatuses, systems and methods involving a plurality of data transmitting systems sharing a frequency channel in which a second stronger transmission signals may be detected after beginning to process a first weaker transmission signal and, in which, it may be advantageous to switch to detecting the second stronger transmitted signal. While the following discussion refers to various protocols (e.g., 802.11, 802.11p, V2X, etc.) for certain communication systems, such discussion is for providing merely an exemplary context to help explain such aspects, and the present disclosure is not necessarily so limited.

Accordingly, in the following description various specific details are set forth to describe specific examples presented herein. It should be apparent to one skilled in the art, however, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element. Also, although aspects and features may in some cases be described in individual figures, it will be appreciated that features from one figure or embodiment can be combined with features of another figure or embodiment even though the combination is not explicitly shown or explicitly described as a combination.

In one example according to the present disclosure, certain embodiments are directed to a method for use in a communication system in which a RF (radio frequency) receiver may be detecting and processing a first signal in an RF channel. Thereafter, a second received signal may be detected, with the second received signal being assessed, by receiver circuitry, as stronger than the first received signal. In response to the assessment of the second received signal being stronger than the first received signal, the RF receiver circuitry may adjust the gain or signal amplification circuitry for continuing to process the second, stronger, received signal in place of the first, weaker, received signal.

In another specific example according to the present disclosure, certain embodiments are directed to a method where assessing that the second received signal is stronger than the first received signal includes or is associated with performing data packet acquisition from the second received signal in parallel with said processing a first received signal by the RF receiver. Further, steps may include aborting the step of processing the first received signal in response to the step of assessing that the second received signal is stronger than the first received signal. During switching to the second, stronger, received signal there may be some latency to detect the switch condition, to abort the packet, adjust a new gain, and to start detecting the new packet. From lab measurements, this time may about 8/4 [us] (in 10/20 MHz mode). Although a large part of the signal preamble (large part of short training field STF) may be lost, a stronger packet may have good SNR (a quality signal to noise ratio, e.g., a range of 10 dB at highest gain down to a few or several dB) so it may be easy to acquire even if some samples are lost.

Turning now to the drawings and relating to the above-disclosed aspects and embodiments, FIG. 1 illustrates an example of an RF receiver 110 detecting a first received signal 155 from a first transmitter 150 and a second, stronger, received signal 145 from a second RF transmitter 140. In this example, the RF receiver 110 may be initially detecting the first signal 145 and the signal strength detector circuit 115 may send a signal to the received signal gain adjust circuit 120 so as to not amplify the signal outside of the dynamic range of the channel receiver circuitry 125. Such a signal, from the signal strength detector, may lock-in a gain setting and not allow further adjustments while receiving the first received signal 155. A second, stronger, received signal 145 may then also be received. In response to the signal strength detector 115 assessing the new signal strength as being larger than the previous signal strength, the RF receiver circuitry 110 may readjust the received signal gain adjust circuitry 120 so as to not amplify the new signal outside of the dynamic range of the channel receiver circuitry 125. (Measured signal strength of the new signal may now include, at least, the first received signal 155 plus the second received signal 145.) The channel receiver circuitry 125 may now receive the second received signal 145 in place of the first received signal 155.

Figure 2:
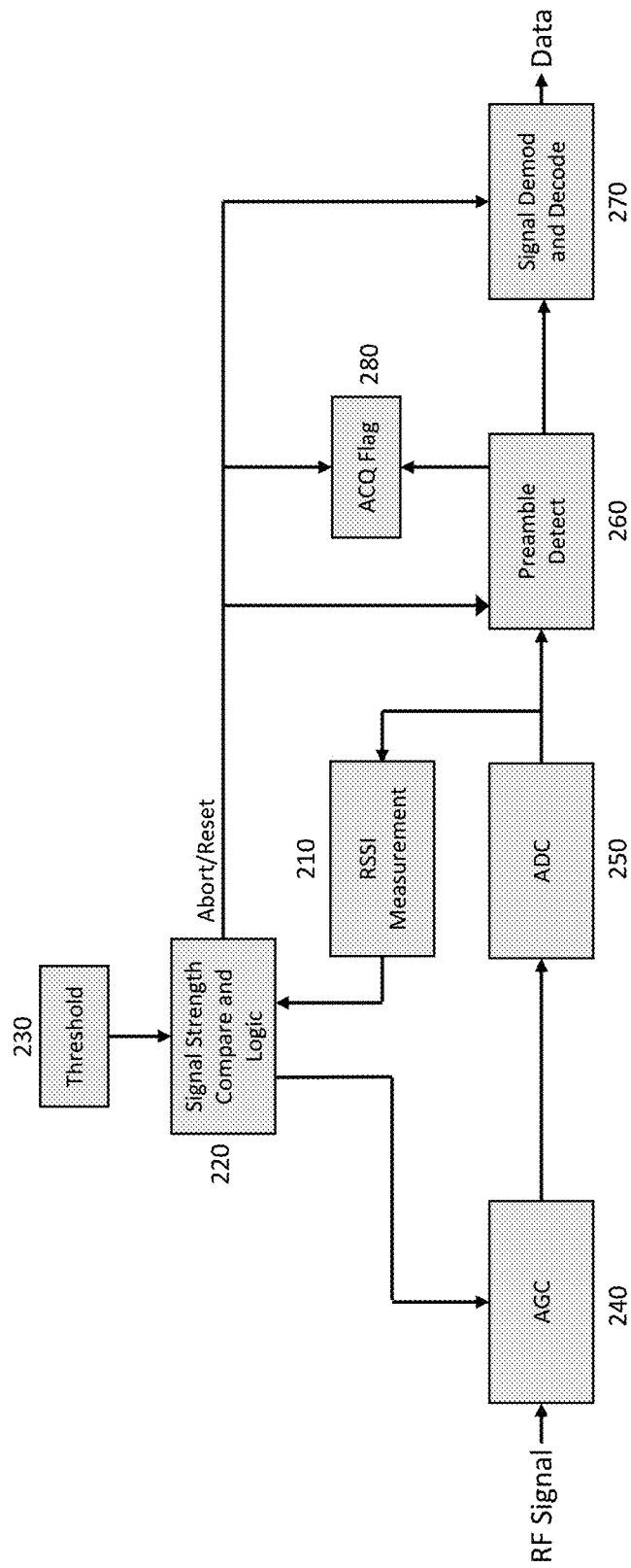
FIG. 2 is a flow diagram illustrating an example of an RF receiver including an abort/reset circuit to allow for detection of second stronger signal transmission after beginning to detect a first weaker signal transmission, in accordance with the present disclosure.

FIG. 2 illustrates a flow diagram of one way, according to the present disclosure, an RF receiver including an RSSI (received signal strength indicator) measurement circuit 210 may allow for detection of second stronger signal transmission after beginning to detect a first weaker signal transmission. In such examples the RF signal to be received may be routed to both AGC (automatic gain control) circuitry 240 as well as RSSI circuitry 210. Upon initial operation the RF signal may include a first signal. Such a signal is routed to the RSSI measurement circuitry 210, is measured for signal strength and such a measurement may be sent to the signal strength compare and logic circuitry 220 which assesses the level and sets an appropriate gain setting to the AGC circuitry 240 (which signal strength level may be indicated, for example, by a threshold difference of SNR/RSSI difference relative to the first signal). An appropriate level may be one that maximizes the signal without exceeding the dynamic range of the ADC (analog to digital converter) 250.

Continuing with the above discussion, during the ongoing operation of receiving RF signals routed to the RSSI measurement circuitry 210, a second signal, larger in signal strength compared to the first signal, may begin transmission. The RSSI may now measure this larger signal strength including, at least, the signal strength of the first signal plus the signal strength of the second signal. This updated, larger measurement is sent to the signal strength compare and logic circuitry 220. The signal strength compare and logic circuitry 220 may compare the signal from the RSSI circuitry 210 to a previous level used to lock-in a gain setting in the AGC circuitry 240. If the updated larger signal strength minus the previous locked-in signal strength is less than or equal to a threshold value 230, the AGC 240 may be left unchanged and an abort/reset signal may be sent to the preamble detect circuitry 260, the ACQ flag circuitry 280, and the signal demod (demodulation) and decode circuitry 270. It may be noted that leaving the gain setting unchanged may allow for faster switching to the detected the second signal. This abort/reset may allow for the reception of the new larger signal in place of the first signal. If the updated larger signal strength minus the previous locked-in signal strength is greater than the threshold value 230, or the RSSI measurement 210 indicates RSSI saturation, the AGC may be readjusted to accommodate the larger signal without exceeding the dynamic range of the ADC 250. In such a situation, the abort/reset may also occur, as described previously.

Figure 3:
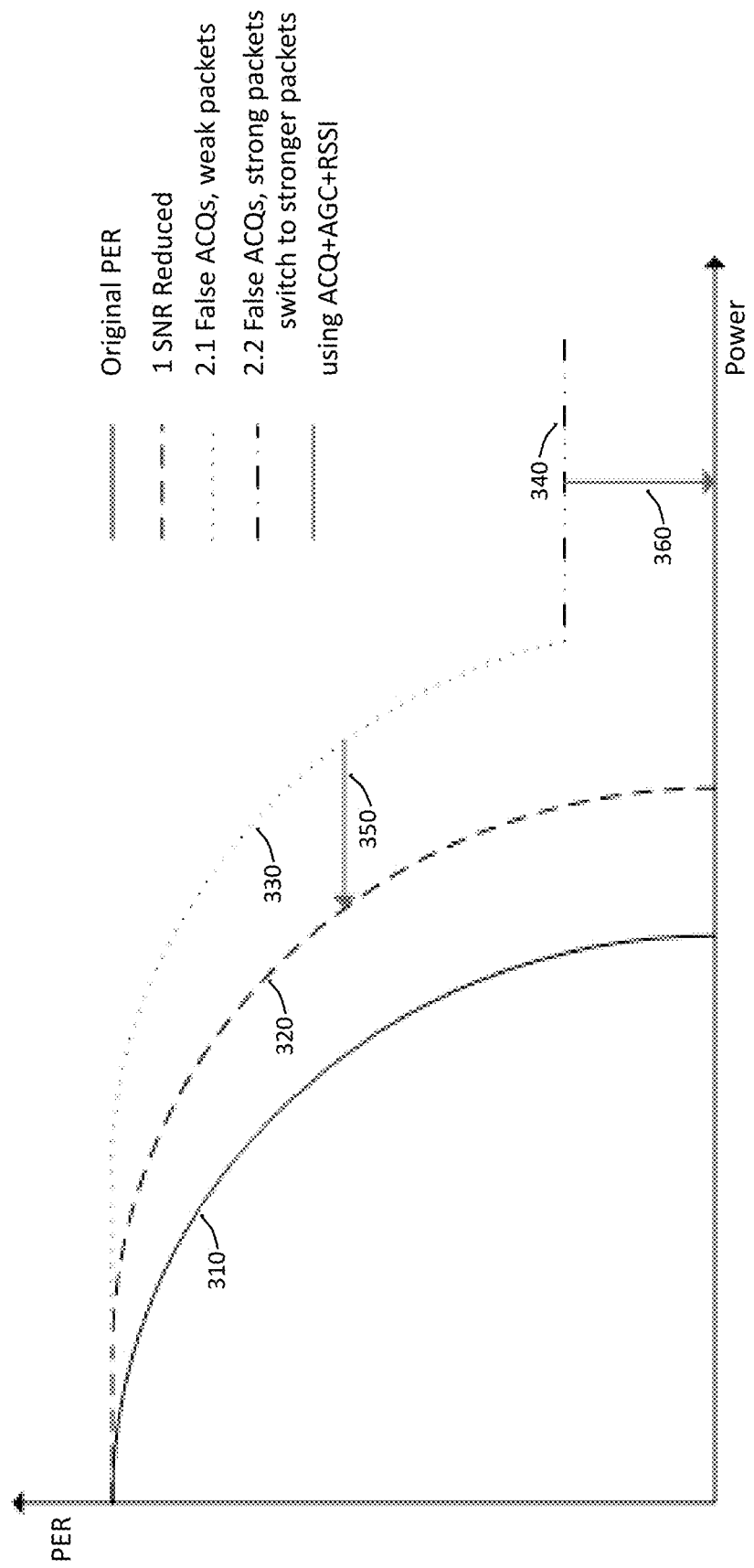
FIG. 3 is a packet error rate (PER) versus detected power graph illustrating the effects of noise/interference, in accordance with the present disclosure.

FIG. 3 is an example graph of packet error rate (PER) versus detected power, illustrating effects of noise/interference. Graph line 310 is an example of a transmitting signal's PER versus detected power level. Graph line 320 is an example illustrating how such a signal's PER may be affected when the environment, system circuitry, or other sources generate increased levels of noise/interference. Threshold line 340 indicates, in accordance with examples of the present disclosure as discussed above, an exemplary level of power at which switching between weaker and stronger signals may be appropriate for reducing (or rendering negligible) the PER, with vertical line 360 depicting the drop off of PER to approximately zero by using any further increased power level (e.g., the arrow indicated as 350, denotes the improvement of switching to detecting the stronger signal with the packet as described in connection with FIG. 2). It may be further appreciated that unrelated transmissions at close frequencies (neighboring channels) may result in increased noise levels above desired sensitivity levels. If the transmitting signal is weak, relative to the interfering noise, this may cause false detections and/or false acquisitions, as seen in graph line 330. Such interference may result in further degradations, these false detections may be mitigated by using steps/techniques described elsewhere in this disclosure.

Figure 4:
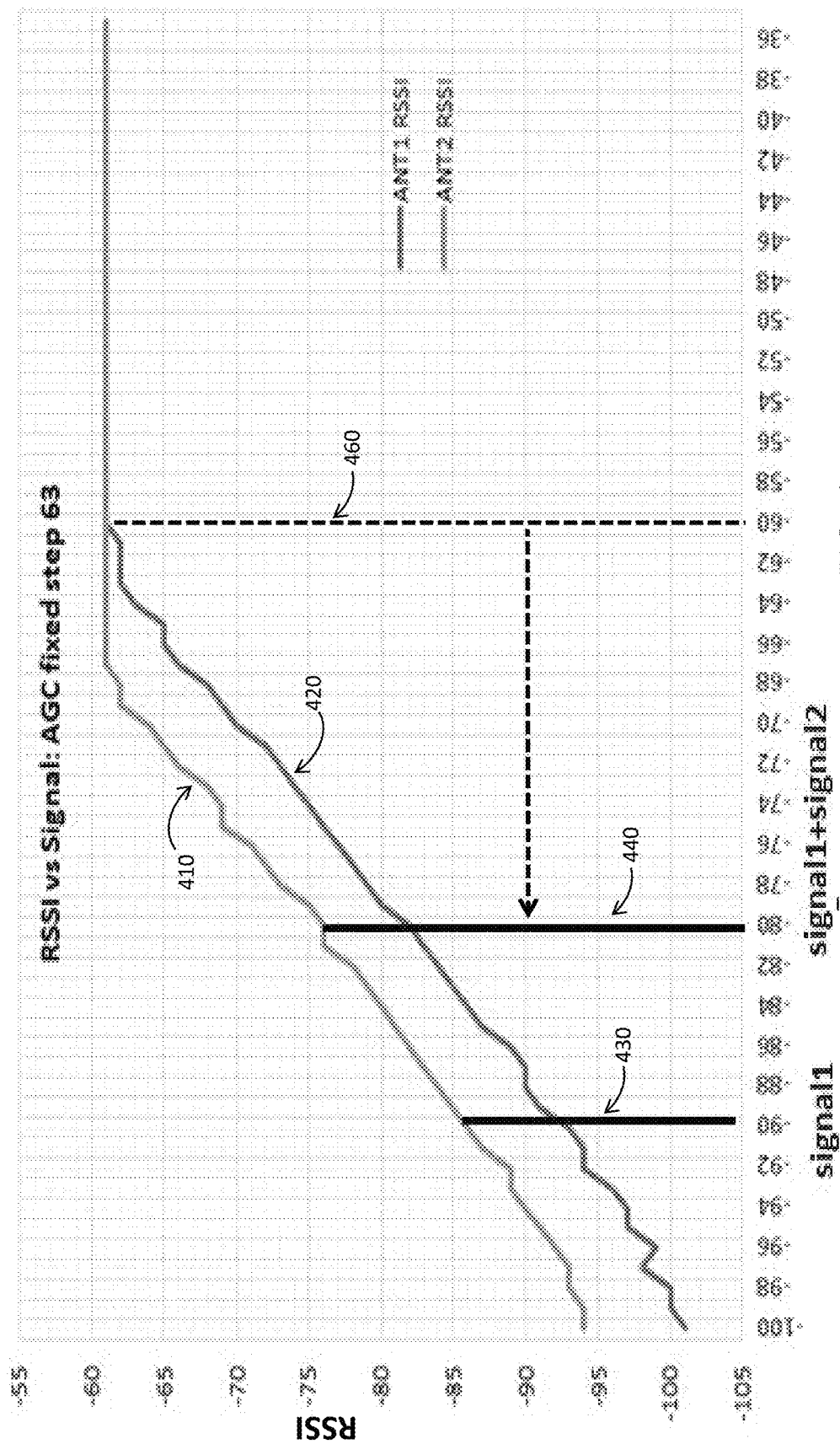
FIG. 4 is an RSSI versus signal strength graph illustrating a first signal transmission and a stronger second signal transmission, in accordance with the present disclosure.

FIG. 4 is an RSSI versus signal strength graph illustrating an example benefiting from AGC adjustment. The example graph also illustrates two RSSI versus signal strength curves; antenna 1 curve is labeled 420 and antenna 2 curve is labeled 410. In this example a first received signal 430 may be received, by antenna 2, with a signal strength of, for example, −90 dBm and an RSSI of −84 dBm with a first gain as adjusted by the AGC circuitry 240. Continuing with this example; if a second, stronger, signal subsequently begins transmission, the received signal will appear as shown in the line 460, which is the combination a first signal transmission and a second stronger signal transmission. Such a received combined signal may now have a signal strength of −60 dBm using a first gain as adjusted by the AGC circuitry 240. The RSSI level, with the combined signals and the first gain level, may indicate that the ADC 250 is being saturated which may cause improper demodulation of the first signal and the second signal to fail. In such a situation it may be judicious to unlock the AGC to allow for readjustment of the gain. This is illustrated by line 440, which is the combination a first signal transmission and a second stronger signal transmission but with the gain adjusted down by 20 dB. Using such a lower gain may allow for the second, larger signal to be demodulated successfully.

One specific example includes using an RF receiver in a vehicle. The RF receiver may include circuitry to assess the incoming signal and, based on the assessment, use circuitry to adjust AGC or signal-amplification. Steps of processing and assessing may be performed while at least the vehicle or a signal-transmit station, from which the first signal or the second signal is transmitted, is moving.

Another specific example includes, a method wherein assessing that the second received signal is stronger than the first received signal includes or is associated with observing energy. Such an assessment may occur concurrently with processing a first received signal, using the RF receiver associated with the second received signal.

In yet another specific example of the instant disclosure, wherein assessing that the second received signal is stronger than the first received signal includes using an RSSI circuit. Such an RSSI circuit may operate concurrently with processing a first received signal by the RF receiver. This allows for observation of energy associated with the second received signal.

In certain more-specific examples, the method and circuitry may adjust gain or signal-amplification circuitry including reducing a gain level provided by an automatic gain control (AGC) circuit. Such a reduction in level may allow for continuing to process the second received signal and extract data therefrom in place of the first received signal. Such data extraction may be performed within an allotted transmission or reception time associated with the second signal thereby allowing for the acquisition of all payload data carried by the second signal.

In certain other examples, assessing that the second received signal is stronger than the first received signal may be an indication, in the RF receiver, that the second received signal is from a signal-transmit station which is closer to the RF receiver than another signal-transmit station from which the first signal is transmitted.

In another example embodiment, the RF receiver may be part of a transceiver that communicates data wirelessly via CSMA or 802.11 communications protocols.

In certain specific examples, the second received signal may be sufficiently stronger than the first received signal, as such it may cause the second received signal to interfere with data extracted from the first received signal.

In yet another example, the step of detecting presence of a second received signal while the first received signal is being processed may include using a signal acquisition circuit in parallel with a circuit to decode or extract data from the first signal.

In yet another example embodiment of the instant disclosure, the adjusting of gain or signal-amplification circuitry, using for example an AGC circuit, may be performed to obtain error-free or clipless processing of the second signal.

In another example, the adjusting includes unfreezing of a gain level of the gain or signal-amplification circuitry and readjusting the gain or signal-amplification circuitry for receiving the second signal. This adjustment may be made to assure the received signal does not exceed the dynamic range of subsequent circuitry, such as an ADC. Further adjustment may include starting reception of a new packet, from the second signal, by implementing a reset of reception circuitry in the RF receiver. Such a reset may be triggered or timed relative to an indication of acquisition of the new packet.

The above-noted adjustment for dynamic range may be implemented based on signal levels as measured by the RSSI circuitry. If the RSSI value indicates saturation, the signal may be exceeding the dynamic range for the subsequent circuitry.

A further example embodiment according to the present disclosure is directed to an apparatus for use in a communication system in which a RF (radio frequency) receiver may be detecting and processing a first signal in an RF channel. During such detecting and processing of the first signal, a second received signal may be detected. In this example, the second received signal may be assessed, by receiver circuitry, as stronger than the first received signal. In response to the assessment of the second received signal being stronger than the first received signal, the RF receiver circuitry may adjust the gain or signal amplification circuitry for continuing to process the second, stronger, received signal in place of the first, weaker, received signal and thereby extracting data from the second signal.

The skilled artisan would recognize that various terminology as used in the Specification (including claims) connote a plain meaning in the art unless otherwise indicated. As examples, the Specification describes and/or illustrates aspects useful for implementing the claimed disclosure by way of various circuits or circuitry which may be illustrated as or using terms such as blocks, modules, device, system, unit, controller, and/or other circuit-type depictions (e.g., reference numerals 115 and 120 of FIG. 1 depict a block/module as described herein). Such circuits or circuitry are used together with other elements to exemplify how certain embodiments may be carried out in the form or structures, steps, functions, operations, activities, etc. For example, in certain of the above-discussed embodiments, one or more modules are discrete logic circuits or programmable logic circuits configured and arranged for implementing these operations/activities, as may be carried out in the approaches shown in FIGS. 1 and 2. In certain embodiments, such a programmable circuit is one or more computer circuits, including memory circuitry for storing and accessing a program to be executed as a set (or sets) of instructions (and/or to be used as configuration data to define how the programmable circuit is to perform), and an algorithm or process as described above is used by the programmable circuit to perform the related steps, functions, operations, activities, etc. Depending on the application, the instructions (and/or configuration data) can be configured for implementation in logic circuitry, with the instructions (whether characterized in the form of object code, firmware or software) stored in and accessible from a memory (circuit). As another example, where the Specification may make reference to a "first [type of structure]", a "second [type of structure]", etc., where the [type of structure] might be replaced with terms such as ["circuit", "circuitry" and others], the adjectives "first" and "second" are not used to connote any description of the structure or to provide any substantive meaning.

Based upon the above discussion and illustrations, those skilled in the art will readily recognize that various modifications and changes may be made to the various embodiments without strictly following the exemplary embodiments and applications illustrated and described herein. For example, methods as exemplified in the Figures may involve steps carried out in various orders, with one or more aspects of the embodiments herein retained, or may involve fewer or more steps. For instance, as shown in FIG. 2. Such modifications do not depart from the true spirit and scope of various aspects of the disclosure, including aspects set forth in the claims

What is claimed is:

1. A method for communicating over a channel, the method comprising:
    processing, by a radio frequency (RF) receiver, a first received signal from an RF channel;
    detecting, by the RF receiver and while the first received signal is being processed, a second received signal from the RF channel;
    comparing a first signal strength of the first received signal and a second signal strength of the second received signal;
    in response to the second signal strength being greater than the first signal strength, adjusting gain or signal-amplification circuitry based on the second signal strength, wherein adjusting gain or signal-amplification circuitry based on the second signal strength comprises:
        unfreezing a gain level of the gain or signal-amplification circuitry, and
        readjusting the gain level for receiving the second received signal;
    starting reception of a new packet from the second received signal based on a reset of reception circuitry in the RF receiver, wherein the reset of the reception circuitry is triggered or timed relative to an indication of acquisition of the new packet; and
    processing, by the RF receiver, the second received signal and extracting data therefrom in place of the first received signal.

2. The method of claim 1, wherein comparing the first signal strength and the second signal strength comprises:
    performing, by the RF receiver, data packet acquisition with the second received signal in parallel with the processing of the first received signal; and
    in response to the second signal strength being greater than the first signal strength, ending the processing of the first received signal.

3. The method of claim 1, wherein:
    a vehicle comprises the RF receiver;
    a signal-transmit station transmits at least one of the first and the second received signals; and
    the processing and comparing are performed while at least one of the vehicle and the signal-transmit station is moving.

4. The method of claim 1, wherein comparing the first signal strength and the second signal strength comprises observing, concurrently with the processing of the first received signal by the RF receiver, an energy associated with the second received signal.

5. The method of claim 1, wherein comparing the first signal strength and the second signal strength comprises operating, concurrently with the processing of the first received signal by the RF receiver, a receiver-signal-strength-indication (RSSI) circuit to observe an energy associated with the second received signal.

6. The method of claim 1, wherein adjusting the gain or signal-amplification circuitry comprises reducing a gain level provided by an automotive gain control (AGC) circuit, and wherein processing the second received signal and extracting data therefrom in place of the first received signal is performed within an allotted transmission or reception time associated with the second received signal, such that payload data carried by the second received signal is acquired.

7. The method of claim 1, wherein comparing the first signal strength and the second signal strength comprises obtaining, by the RF receiver, an indication that the second received signal is from a signal-transmit station which is closer to the RF receiver than another signal-transmit station from which the first received signal is transmitted.

8. The method of claim 1, wherein the RF receiver is part of a transceiver that communicates data wirelessly via CSMA or 802.11 communications protocols.

9. The method of claim 1, wherein a difference between the second signal strength and the first signal strength satisfies an interference criterion, wherein the interference criterion is representative of the second received signal interfering with data extracted from the first received signal.

10. The method of claim 1, wherein comparing the first signal strength and the second signal strength comprises determining a threshold or difference in signal-to-noise (SNR) ratio and/or received signal strength indication between the first received signal and the second received signal is satisfied, to cause the second received signal to interfere with data extracted from the first received signal.

11. The method of claim 1, wherein detecting the second received signal comprises operating a signal acquisition circuit in parallel with a circuit to decode or extract data from the first received signal.

12. The method of claim 1, wherein adjusting gain or signal-amplification circuitry based on the second signal strength reduces at least one of errors and clipping in the processing of the second received signal.

13. The method of claim 1, wherein the RF receiver is part of a transceiver that is to communicate data wirelessly via a 802.11 communications protocol, and wherein comparing the first signal strength and the second signal strength comprises determining the second received signal is stronger than the first received signal by a predetermined amount associated with an interference estimate.

14. An apparatus for communicating via a radio frequency (RF) channel, the apparatus comprising:
    an RF receiver configured to receive a first received signal and a second received signal from an RF channel;
    signal-detection circuitry, within the RF receiver, configured to detect presence of the second received signal in the RF channel while the first received signal is being processed; and
    signal-processing circuitry, within the RF receiver, configured to:
        assess that a second signal strength of the second received signal is greater than a first signal strength of the first received signal;
        in response to the second signal strength being greater than the first signal strength, cause a gain or signal-amplification circuitry to be adjusted based on the second signal strength, wherein the signal-processing circuitry is configured to cause the gain or signal-amplification circuitry to be adjusted based on the second signal strength by being configured to:

cause a gain level of the gain or signal-amplification circuitry to be unfreezed; and cause the gain level for receiving the second received signal to be adjusted;

cause reception of a new packet from the second received signal based on a reset of the signal-detection circuitry, wherein the reset of the signal-detection circuitry is triggered or timed relative to an indication of acquisition of the new packet; and cause the second received signal to be processed in place of the first received signal.

15. The apparatus of claim 14, wherein the signal-processing circuitry is further configured to, in response to the second signal strength being greater than the first signal strength, cause processing of the first received signal to cease, and wherein the RF receiver is configured to be installed in a vehicle for operation by said circuitries while the vehicle is moving.

16. The apparatus of claim 14, wherein the signal-processing circuitry is further configured to observe energy related to the first received signal and/or second received signal, concurrently while processing the first received signal by the RF receiver.

17. The apparatus of claim 14, wherein the signal-processing circuitry is further configured to operate, concurrently with the first received signal processing, a signal-strength indication circuit to observe energy associated with the second received signal, the apparatus further comprising:

an automatic gain control circuit configured to control signal gain; and signal-amplification circuitry configured to reduce a gain level provided by the automatic gain control circuit.

18. The apparatus of claim 14, wherein the signal-processing circuitry is configured to assess that the second signal strength is greater than the first signal strength based on an indication that the second received signal is from a signal-transmit station that is closer to the RF receiver than another signal-transmit station from which the first received signal is transmitted.

19. The apparatus of claim 14, wherein the RF receiver is part of a transceiver that is configured to:

communicate data wirelessly via CSMA or 802.11 communications protocols; and switch to processing of the second received signal in response to an indication that the second signal strength is greater than the first signal strength by a predetermined amount associated with an interference estimate.

* * * * *